United States Patent
Nakako et al.

(10) Patent No.: US 11,483,936 B2
(45) Date of Patent: Oct. 25, 2022

(54) METHOD FOR PRODUCING JOINED BODY, AND JOINING MATERIAL

(71) Applicant: HITACHI CHEMICAL COMPANY, LTD., Tokyo (JP)

(72) Inventors: Hideo Nakako, Tokyo (JP); Yoshinori Ejiri, Tokyo (JP); Dai Ishikawa, Tokyo (JP); Chie Sugama, Tokyo (JP); Yuki Kawana, Tokyo (JP); Motohiro Negishi, Tokyo (JP); Yuichi Yanaka, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 74 days.

(21) Appl. No.: 16/762,041

(22) PCT Filed: Nov. 8, 2018

(86) PCT No.: PCT/JP2018/041517
§ 371 (c)(1),
(2) Date: May 6, 2020

(87) PCT Pub. No.: WO2019/093427
PCT Pub. Date: May 16, 2019

(65) Prior Publication Data
US 2020/0344893 A1 Oct. 29, 2020

(30) Foreign Application Priority Data
Nov. 8, 2017 (JP) .............................. JP2017-215792

(51) Int. Cl.
*H05K 3/32* (2006.01)
*H01B 1/22* (2006.01)

(52) U.S. Cl.
CPC ................. *H05K 3/32* (2013.01); *H01B 1/22* (2013.01)

(58) Field of Classification Search
CPC .................................. H01B 1/22; H05K 3/32
See application file for complete search history.

(56) References Cited

U.S. PATENT DOCUMENTS

| 5,891,366 A | * | 4/1999 | Gruenwald | ............ H05K 3/323 |
| | | | | 252/514 |
| 7,658,988 B2 | * | 2/2010 | Lin | ...................... H05K 1/0373 |
| | | | | 428/209 |

(Continued)

FOREIGN PATENT DOCUMENTS

| JP | 2007-046162 A | * | 2/2007 |
| JP | 2007321215 A | * | 12/2007 |

(Continued)

*Primary Examiner* — Carl J Arbes
(74) *Attorney, Agent, or Firm* — Fitch, Even, Tabin & Flannery, LLP

(57) ABSTRACT

Provided is a method for producing a joined body, the method including a first step of preparing a laminated body which includes a first member having a metal pillar provided on a surface thereof, a second member having an electrode pad provided on a surface thereof, and a joining material provided between the metal pillar and the electrode pad and containing metal particles and an organic compound, and a second step of heating the laminated body to sinter the joining material at a predetermined sintering temperature, in which the joining material satisfies the condition of the following Formula (I):

$$(M_1 - M_2)/M_1 \times 100 \geq 1.0 \qquad (I)$$

[in Formula (I), $M_1$ represents a mass of the joining material when a temperature of the joining material reaches the sintering temperature in the second step, and $M_2$ represents a non-volatile content in the joining material.]

17 Claims, 3 Drawing Sheets

(56) References Cited

U.S. PATENT DOCUMENTS

| | | | |
|---|---|---|---|
| 8,951,445 B2* | 2/2015 | Brunschwiler | H01L 24/32 |
| | | | 252/514 |
| 2011/0018136 A1* | 1/2011 | Bedair | H05K 1/16 |
| | | | 257/773 |
| 2011/0143502 A1 | 6/2011 | Castro | |
| 2014/0305684 A1* | 10/2014 | Kang | H01B 1/22 |
| | | | 174/257 |
| 2016/0218057 A1* | 7/2016 | Lee | H01L 21/486 |
| 2016/0351529 A1 | 12/2016 | Brunschwiler et al. | |

FOREIGN PATENT DOCUMENTS

| | | | |
|---|---|---|---|
| JP | 2008013466 A | * | 1/2008 |
| JP | 2009197133 A | * | 9/2009 |
| JP | 2015-065123 A | | 4/2015 |
| JP | 2017-103180 A | | 6/2017 |

* cited by examiner (a)

(c)

(a)

(b)

(c)

(a)

(b)

(c)

METHOD FOR PRODUCING JOINED BODY, AND JOINING MATERIAL

CROSS-REFERENCE TO RELATED APPLICATIONS

This application is a U.S. national phase application filed under 35 U.S.C. § 371 of International Application No. PCT/JP2018/041517, filed Nov. 8, 2018, designating the United States, which claims priority from Japanese Application No. 2017-215792, filed Nov. 8, 2017, which are hereby incorporated herein by reference in their entirety.

TECHNICAL FIELD

The present invention relates to a method for producing a joined body and a joining material.

BACKGROUND ART

In general, solder joining is used for electrical joining in electronic devices. For example, in flip-chip joining of microdevices, solder balls, solder paste, and the like are used for joining microdevices and electrode pads on a substrate.

In recent years, in the flip-chip joining, with the narrower pitch of terminals, a method of forming a metal pillar on a microdevice and solder-joining the metal pillar and an electrode pad on a substrate has been used. However, in solder joining, there are problems such as (1) occurrence of Kirkendall voids between the solder and the electrode pad and between the solder and the metal pillar, (2) occurrence of joining failure caused by the solder being melted in the case of performing a reflow process again after joining, and (3) occurrence of signal reflection caused by impedance mismatch at a dissimilar metal interface.

On the other hand, a method has been proposed in which joining between a copper pillar provided on a microdevice and a copper pad on a substrate is performed using a joining agent (copper paste) obtained by mixing copper microparticles and copper nanoparticles (Patent Literature 1).

CITATION LIST

Patent Literature

Patent Literature 1: U.S. Unexamined Patent Publication No. 2016/0351529

SUMMARY OF INVENTION

Technical Problem

However, in conventional methods of Patent Literature 1 and the like, members to be joined need to be thermocompression bonded under a high pressure (for example, under a pressure of 1.0 Mpa or more). For this reason, mass production problems such as the need for a special production apparatus and the need for individually applying a pressure in the case of producing a plurality of joined structures arise. In addition, in thermocompression bonding under a high pressure, a load is applied to members to be joined (for example, microdevices), which may cause problems such as a decrease in mass production yield and a decrease in long-term reliability. On the other hand, as a result of studies by the present inventors, it becomes clear that joining failure is likely to occur in the case of reducing a pressure applied during joining in the conventional methods.

In this regard, an object of the present invention is to provide a method for producing a joined body in which joining failure hardly occurs even in the case of reducing a pressure applied during joining and a joining material used in the method.

Solution to Problem

An aspect of the present invention relates to a method for producing a joined body, the method including a first step of preparing a laminated body which includes a first member having a metal pillar provided on a surface thereof, a second member having an electrode pad provided on a surface thereof and being disposed with the metal pillar and the electrode pad facing each other, and a joining material provided between the metal pillar and the electrode pad and containing metal particles and an organic compound, and a second step of heating the laminated body to sinter the joining material at a predetermined sintering temperature. In this production method, the joining material satisfies the condition of the following Formula (I):

$$(M_1-M_2)/M_1 \times 100 \geq 1.0 \quad (I)$$

[in Formula (I), $M_1$ represents a mass of the joining material when a temperature of the joining material reaches the sintering temperature in the second step, and $M_2$ represents a non-volatile content in the joining material.]

According to the method for producing a joined body, even in the case of reducing a pressure applied during joining, joining failure hardly occurs. Therefore, in the method for producing a joined body, it is not necessary to apply a high pressure during joining, damage to members to be joined can be reduced, and effects such as simplification of a process, simplification of a joining apparatus, and improvement in a production yield can be obtained.

The reason why the production method can reduce a pressure during joining is not clear, but as one of reasons, destruction (cracks, voids, or the like) of a joint (a layer formed by the joining material) or peeling at an interface between the joint and the first member or the second member caused by a thermal expansion rate difference between the first member (for example, a microdevice) and the second member (for example, a substrate) can be suppressed. That is, in a case where the organic compound in the joining material is removed while raising temperature before the joining material is sintered, since a joining force does not act between the metal particles remaining in the joint, a joining force between the first member and the second member becomes very weaker. As a result, destruction or peeling of the joint occurs due to a thermal expansion difference between the first member and the second member according to an increase in temperature during sintering. On the other hand, it is speculated that since the production method makes a certain amount of the organic compound to remain in the joint up to the sintering temperature and the metal particles are joined by the organic compound, destruction or peeling of the joint due to a thermal expansion difference as described above can be suppressed.

The organic compound in the joining material may include at least one selected from the group consisting of an organic solvent having a boiling point of 300° C. or higher and a thermally decomposable resin of which a 5% by weight reduction temperature in a reducing atmosphere is 100° C. or higher. In this case, the condition of the above Formula (I) can be easily satisfied.

Another aspect of the present invention relates to a joining material being used for joining a metal pillar and an electrode pad. This joining material contains metal particles and at least one organic compound selected from the group consisting of an organic solvent having a boiling point of 300° C. or higher and a thermally decomposable resin of which a 5% by weight reduction temperature in a reducing atmosphere is 100° C. or higher. According to this joining material, in the method for producing a joined body, the condition of Formula (I) can be easily satisfied. Therefore, according to this joining material, even in the case of reducing a pressure applied during joining, joining failure hardly occurs.

In the production method of the above aspect and the joining material of the above aspect, the thermally decomposable resin may include at least one selected from the group consisting of polycarbonate, poly(meth)acrylic acid, poly(meth)acrylic acid ester, and polyester. By using these thermally decomposable resins, occurrence of joining failure can be further suppressed.

In the production method of the above aspect and the joining material of the above aspect, the total of a content of the organic solvent and a content of the thermally decomposable resin may be 1.0% by mass or more on the basis of the total mass of the joining material. In this case, the condition of the above Formula (I) can be easily satisfied and occurrence of joining failure can be further suppressed.

The sintering temperature in the second step may be 150 to 300° C. In other words, the joining material may be a joining material which is used for joining the metal pillar and the electrode pad by being sintered at a sintering temperature of 150 to 300° C. In the case of such a sintering temperature, the condition of the above Formula (I) can be easily satisfied and occurrence of joining failure can be further suppressed.

According to the production method, even without pressurization or under a pressure of 0.1 MPa or less, joining failure hardly occurs, and thus a joined body in a satisfactory joined state can be obtained. Therefore, in the second step, the joining material may be sintered without pressurization or under a pressure of 0.1 MPa or less. In other words, the joining material may be used for joining the metal pillar and the electrode pad by being sintered without pressurization or under a pressure of 0.1 MPa or less. In this case, the effect of reducing damage to members to be joined and the effect of improving mass productivity are more easily obtainable.

The metal particles in the joining material may include sub-micro copper particles having a volume average particle size of 0.11 to 0.80 µm and flake-shaped micro copper particles having a volume average particle size of 2.0 to 50 µm and an aspect ratio of 3.0 or more, a content of the sub-micro copper particles may be 30 to 90% by mass on the basis of the total mass of the metal particles, and a content of the micro copper particles may be 10 to 50% by mass on the basis of the total mass of the metal particles. In this case, there is a tendency that occurrence of joining failure can be further suppressed.

The reason why such an effect is obtained is not clear, but as one of reasons, it is considered that joining failure due to the volume shrinkage of the joining material during joining can be suppressed. That is, during joining, when the organic compound contained in the joining material is removed by heating, the joining material isotropically contracts in volume. In particular, since 50% by volume or more of the organic compound based on volumetric fraction is contained as a dispersion medium in a general joining material in order to form a paste, 50% by volume or more of volume shrinkage occurs in such a joining material. Further, when the joining material is sintered, voids between the metal particles are reduced, and thus further volume shrinkage occurs. Such volume shrinkage causes stress between the metal pillar which have a fixed size and the joint and between the electrode pad which have a fixed size and the joint, and thus causes destruction (cracks, voids, or the like) or peeling of the joint. On the other hand, the flake-shaped micro copper particles are oriented in approximately parallel to a joining surface (adhering surface) of the metal pillar and the joining surface (adhering surface) of the electrode pad by a shear force at the time of applying the joining material and laminating the members (for example, at the time of mounting a chip). The oriented flake-shaped micro copper particles form a flake structure and constrain the shrinkage of the flake structure in a plane direction, and as a result, the volume shrinkage of the joining material in a direction in approximately parallel to the joining surface of the metal pillar and the joining surface of the electrode pad are suppressed. As a result, occurrence of destruction and peeling of the joint mentioned above can be suppressed.

Advantageous Effects of Invention

According to the present invention, it is possible to provide a method for producing a joined body in which joining failure hardly occurs even in the case of reducing a pressure applied during joining and a joining material used in the method.

DESCRIPTION OF EMBODIMENTS

Figure 1:
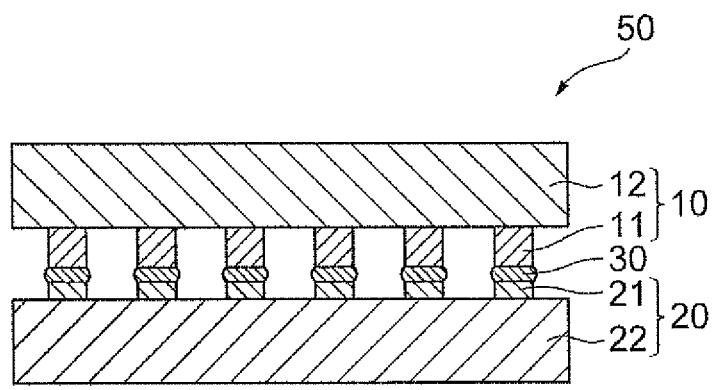
FIG. 1 is a schematic cross-sectional view illustrating a method for producing a joined body of an embodiment.
Figure 1:
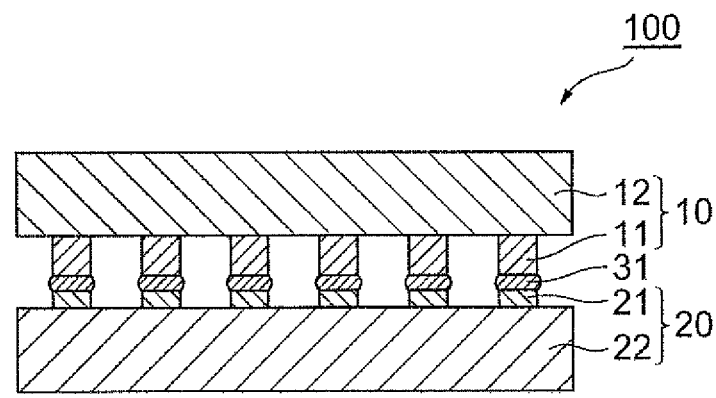

Hereinafter, embodiments of the present invention will be described in detail. However, the present invention is not limited to the following embodiments.

A method for producing a joined body of an embodiment includes a first step of preparing a laminated body which includes a first member having a metal pillar provided on a surface thereof, a second member having an electrode pad provided on a surface thereof and being disposed with the metal pillar and the electrode pad facing each other, and a joining material provided between the metal pillar and the electrode pad and containing metal particles and an organic compound, and a second step of heating the laminated body to sinter the joining material at a predetermined sintering temperature. In this production method, the joining material satisfies the condition of the following Formula (I):

$$(M_1-M_2)/M_1 \times 100 \geq 1.0 \qquad (I)$$

In Formula (I), $M_1$ represents a mass of the joining material when a temperature of the joining material reaches the sintering temperature in the second step, and $M_2$ represents a non-volatile content (for example, a content of the metal particles) in the joining material. That is, $(M_1-M_2)$ means the remaining amount of the volatile component (for example, the organic compound) remaining in the joining material, and the joining material satisfying the above Formula (I) means that, in the second step, the content of the volatile component (for example, the organic compound) in the joining material when the temperature of the joining material reaches the sintering temperature is 1.0% by mass or more on the basis of the total mass of the joining material.

$M_1$ and $M_2$ can be measured by the method described in Examples, and for example, $M_2$ (the non-volatile content in the joining material) is obtained by measuring the mass of the joining material when the joining material before heating in the second step is heated at 300° C. for 2 hours in a reducing atmosphere. In addition, $M_1$ can also be measured by a method in which the joining material is interposed between the metal pillar in the first member and the electrode pad in the second member, the joining material is rapidly cooled immediately after raising temperature simulating the heating process in the second step in a reducing atmosphere (for example, in a hydrogen atmosphere), and the mass of the joined body after rapid cooling is measured. Further, $M_2$ can also be measured using a thermogravimetric measurement/differential thermal analysis (TG/DTA) device.

In the method for producing a joined body, it is considered that the metal particles in the joining material join to each other by the organic compound remaining in the joining material when the temperature of the joining material reaches the sintering temperature, and flexibility is imparted to the joining material. Therefore, in the method for producing a joined body, even in the case of reducing a pressure applied during joining, joining failure hardly occurs, damage to members to be joined can be reduced, and effects such as simplification of a process, simplification of a joining apparatus, and improvement in a production yield can be obtained.

Hereinafter, first, details of the joining material used in the method for producing a joined body of the present embodiment will be described.

<Joining Material>

The joining material of the present embodiment contains at least metal particles and an organic compound. The joining material is, for example, metal paste (for example, copper paste) and is metal paste (for example, copper paste) for joining without pressurization.

(Metal Particles)

Examples of the metal particles include sub-micro copper particles, micro copper particles, and metal particles other than these copper particles. From the viewpoints of obtaining excellent electric conductivity and joining properties, the metal particles preferably include copper particles (particles substantially consisting of only copper) and more preferably include sub-micro copper particles and micro copper particles. In particular, in the case of using sub-micro copper particles and micro copper particles together, volume shrinkage and sintering shrinkage along with drying are easily suppressed, and the joining material is less likely to be peeled off from a joining surface during sintering of the joining material. That is, by using sub-micro copper particles and micro copper particles together, volume shrinkage when the joining material is sintered is suppressed, and the joined body can have more sufficient joining strength. In the case of using the joining material, which uses sub-micro copper particles and micro copper particles together, in joining of a microdevice, the microdevice tends to exhibit more satisfactory die shear strength and connection reliability. In the present specification, for convenience sake, a group of a plurality of metal particles may be referred to as "metal particles." The same applies to sub-micro copper particles, micro copper particles, and other metal particles.

[Sub-Micro Copper Particles]

The sub-micro copper particles are copper particles having a particle size of 0.01 μm or more and less than 1.00 μm. The sub-micro copper particles preferably have sinterability in a temperature range of 150° C. to 300° C. The sub-micro copper particles preferably include copper particles having a particle size of 0.01 to 0.80 μm. The sub-micro copper particles may include copper particles having a particle size of 0.01 to 0.80 μm in an amount of 10% by mass or more, 20% by mass or more, 30% by mass or more, or 100% by mass. The particle size of the copper particles can be calculated, for example, from an SEM image. A powder of the copper particles is placed on a carbon tape for SEM with a spatula and is set as a sample for SEM. This sample for SEM is observed by an SEM apparatus at a magnification of 5000 times. A rectangle that is circumscribed to a copper particle on the SEM image is drawn by using image processing software, and one side of the rectangle is set as a particle size of the particle.

The volume average particle size of the sub-micro copper particles is preferably 0.01 to 0.80 μm. When the volume average particle size of the sub-micro copper particles is 0.01 μm or more, an effect such as suppression of the synthesizing cost of the sub-micro copper particles, satisfactory dispersibility, and suppression of the amount of a surface treatment agent used is easily obtainable. When the volume average particle size of the sub-micro copper particles is 0.80 μm or less, an effect such as excellent sinterability of the sub-micro copper particles is easily obtainable. From the viewpoint of further exhibiting the effect, the volume average particle size of the sub-micro copper particles may be 0.02 μm or more, 0.05 μm or more, 0.10 μm or more, 0.11 μm or more, 0.12 μm or more, 0.15 μm or more, 0.2 μm or more, or 0.3 μm or more. Further, from the viewpoint of further exhibiting the effect, the volume average particle size of the sub-micro copper particles may be 0.60 μm or less, 0.50 μm or less, 0.45 μm or less, or 0.40 μm or less. The volume average particle size of the sub-micro copper particles may be, for example, 0.01 to 0.60 μm, 0.01 to 0.50 μm, 0.02 to 0.80 μm, 0.05 to 0.80 μm, 0.10 to 0.80 μm, 0.11 to 0.80 μm, 0.12 to 0.80 μm, 0.15 to 0.80 μm, 0.15 to 0.60 μm, 0.20 to 0.50 μm, 0.30 to 0.45 μm, or 0.30 to 0.40 μm.

In the present specification, the volume average particle size means 50% volume average particle size. The volume average particle size of the metal particles (for example, copper particles) can be measured, for example, by the following method. First, dry metal particles obtained by removing a volatile component from the metal particles or the joining material serving as a raw material are dispersed in a dispersion medium by using a dispersant. Next, the volume average particle size of the obtained dispersed body is measured by a light-scattering method particle size distribution measuring apparatus (for example, Shimadzu nano particle size distribution measuring apparatus (SALD-7500nano, manufactured by SHIMADZU CORPORATION)). In the case of using a light-scattering method particle size distribution measuring apparatus, as a dispersion medium, hexane, toluene, α-terpineol, 4-methyl-1,3-dioxolan-2-one, and the like can be used.

The shape of the sub-micro copper particles is not particularly limited. Examples of the shape of the sub-micro copper particles include a spherical shape, a bulky shape, a needle shape, a column shape, a flake shape, an approximately spherical shape, and an aggregate thereof. From the viewpoints of dispersibility and filling properties, the shape of the sub-micro copper particles may be a spherical shape, an approximately spherical shape, or a flake shape, and from the viewpoints of combustibility, dispersibility, mixability with flake-shaped micro particles (for example, flake-shaped micro copper particles), and the like, the shape of the sub-micro copper particles may be a spherical shape or an approximately spherical shape. In the present specification, the "flake shape" includes a flat plate shape such as a plate shape and a scale shape.

From the viewpoints of dispersibility, filling properties, and mixability with flake-shaped micro particles (for example, flake-shaped micro copper particles), the aspect ratio of the sub-micro copper particles may be 5.0 or less or 3.0 or less. In the present specification, the "aspect ratio" represents a ratio of "a long side of particles/a thickness of particles." The long side of particles and the thickness of particles can be obtained, for example, from an SEM image of particles.

From the viewpoint of dispersibility of the sub-micro copper particles, the sub-micro copper particles may be treated with a surface treatment agent. The surface treatment agent may be, for example, adsorbed on the surface of the sub-micro copper particles by a hydrogen bond or the like, or may react with the sub-micro copper particles to bond to the surface of the sub-micro copper particles. That is, the sub-micro copper particles may have a compound derived from a specific surface treatment agent. The surface treatment agent is included in an organic compound contained in the joining material.

Examples of the surface treatment agent include organic acids having 2 to 18 carbon atoms. Examples of the organic acids having 2 to 18 carbon atoms include saturated fatty acids such as acetic acid, propanoic acid, butanoic acid, pentanoic acid, hexanoic acid, heptanoic acid, caprylic acid, methylheptanoic acid, ethylhexanoic acid, propylpentanoic acid, pelargonic acid, methyloctanoic acid, ethylheptanoic acid, propylhexanoic acid, capric acid, methylnonanoic acid, ethyloctanoic acid, propylheptanoic acid, butylhexanoic acid, undecanoic acid, methyldecanoic acid, ethylnonanoic acid, propyloctanoic acid, butylheptanoic acid, lauric acid, methylundecanoic acid, ethyldecanoic acid, propylnonanoic acid, butyloctanoic acid, pentylheptanoic acid, tridecanoic acid, methyldodecanoic acid, ethylundecanoic acid, propyldecanoic acid, butylnonanoic acid, pentyloctanoic acid, myristic acid, methyltridecanoic acid, ethyldodecanoic acid, propylundecanoic acid, butyldecanoic acid, pentylnonanoic acid, hexyloctanoic acid, pentadecanoic acid, methyltetradecanoic acid, ethyltridecanoic acid, propyldodecanoic acid, butylundecanoic acid, pentyldecanoic acid, hexylnonanoic acid, palmitic acid, methylpentadecanoic acid, ethyltetradecanoic acid, propyltridecanoic acid, butyldodecanoic acid, pentylundecanoic acid, hexyldecanoic acid, heptylnonanoic acid, heptadecanoic acid, octadecanoic acid, methylcyclohexanecarboxylic acid, ethylcyclohexanecarboxylic acid, propylcyclohexanecarboxylic acid, butylcyclohexanecarboxylic acid, pentylcyclohexanecarboxylic acid, hexylcyclohexanecarboxylic acid, heptylcyclohexanecarboxylic acid, octylcyclohexanecarboxylic acid, and nonylcyclohexanecarboxylic acid; unsaturated fatty acids such as octenoic acid, nonenoic acid, methylnonenoic acid, decenoic acid, undecenoic acid, dodecenoic acid, tridecenoic acid, tetradecenoic acid, myristoleic acid, pentadecenoic acid, hexadecenoic acid, palmitoleic acid, sapienic acid, oleic acid, vaccenic acid, linolic acid, linoleic acid, and linolenic acid; and aromatic carboxylic acids such as terephthalic acid, pyromellitic acid, o-phenoxybenzoic acid, methylbenzoic acid, ethylbenzoic acid, propylbenzoic acid, butylbenzoic acid, pentylbenzoic acid, hexylbenzoic acid, heptylbenzoic acid, octylbenzoic acid, and nonylbenzoic acid. The organic acids may be used alone or in combination of two or more kinds thereof. By combining such an organic acid and the sub-micro copper particles, there is a tendency that both dispersibility of the sub-micro copper particles and removal properties of the organic acid in sintering can be achieved.

The treatment amount of the surface treatment agent may be 0.07 to 2.10% by mass, 0.10 to 1.60% by mass, or 0.20 to 1.10% by mass on the basis of the total mass of the sub-micro copper particles after surface treatment, from the viewpoint of dispersibility of the sub-micro copper particles. The treatment amount of the surface treatment agent may be 0.07% by mass or more, 0.10% by mass or more, or 0.20% by mass or more on the basis of the total mass of the sub-micro copper particles after surface treatment. The treatment amount of the surface treatment agent may be 2.10% by mass or less, 1.60% by mass or less, or 1.10% by mass or less on the basis of the total mass of the sub-micro copper particles after surface treatment.

The treatment amount of the surface treatment agent may be an amount in which one molecular layer to three molecular layers adhere to the surface of the sub-micro copper particles. This treatment amount is measured by the following method. W1 (g) of the surface-treated sub-micro copper particles is weighed into an alumina crucible (for example, manufactured by AS ONE Corporation, Model No.: 1-7745-07) treated at 700° C. for 2 hours in air and then is sintered at 700° C. for 1 hour in air. Thereafter, the treatment was performed at 300° C. for 1 hour in hydrogen and a mass W2 (g) of the copper particles in the crucible is measured. Next, the treatment amount of the surface treatment agent is calculated based on the following equation.

Treatment amount of Surface treatment agent (% by mass)=$(W1-W2)/W1\times100$

As the sub-micro copper particles, commercially available sub-micro copper particles can be used. Examples of materials containing commercially available sub-micro copper particles include CH-0200 (manufactured by MITSUI MINING & SMELTING CO., LTD., volume average particle size: 0.36 μm), HT-14 (manufactured by MITSUI MINING & SMELTING CO., LTD., volume average particle size: 0.41 μm), CT-500 (manufactured by MITSUI MINING & SMELTING CO., LTD., volume average particle size: 0.72 μm), Tn—Cu100 (manufactured by TAIYO NIPPON SANSO CORPORATION, volume average particle size: 0.12 μm), and Cu—C-40 (manufactured by Fukuda Metal Foil & Powder Co., Ltd., volume average particle size: 0.2 μm).

The content of the sub-micro copper particles may be 30 to 90% by mass, 35 to 90% by mass, 40 to 85% by mass, or 50 to 85% by mass on the basis of the total mass of the metal particles. The content of the sub-micro copper particles may be 30% by mass or more, 35% by mass or more, 40% by mass or more, or 50% by mass or more on the basis of the total mass of the metal particles. The content of the sub-micro copper particles may be 90% by mass or less or 85% by mass or less on the basis of the total mass of the metal particles. When the content of the sub-micro copper particles is within the above range, it becomes easy to secure the joining strength of the joined body to be produced by sintering the joining material. In the case of using the joining material in joining of microdevices, the microdevices tend to exhibit satisfactory die shear strength and connection reliability. The content does not include the amount of the surface treatment agent. The total mass of the metal particles does not include the amount of the surface treatment agent adsorbed on the surface of the metal particles.

[Micro Copper Particles]

The micro copper particles are copper particles having a particle size of 1 µm or more and less than 50 µm. The micro copper particles preferably include copper particles having a particle size of 2.0 to 50 µm. The micro copper particles may include copper particles having a particle size of 2.0 to 50 µm in an amount of 50% by mass or more, 70% by mass or more, 80% by mass or more, or 100% by mass.

The volume average particle size of the micro copper particles is preferably 2.0 to 50 µm. When the volume average particle size of the micro copper particles is within the above range, the volume shrinkage, occurrence of voids, and the like when the joining material is sintered can be reduced, and it becomes easy to secure the joining strength of the joined body to be produced by sintering the joining material. In the case of using the joining material in joining of microdevices, the microdevices tend to exhibit satisfactory die shear strength and connection reliability. From the viewpoint of further exhibiting the effect, the volume average particle size of the micro copper particles may be 2.0 to 20 µm, 2.0 to 10 µm, 3.0 to 20 µm, or 3.0 to 10 µm. The volume average particle size of the micro copper particles may be 2.0 µm or more or 3.0 µm or more. The volume average particle size of the micro copper particles may be 50 µm or less, 20 µm or less, or 10 µm or less.

The shape of the micro copper particles is not particularly limited. Examples of the shape of the micro copper particles include a spherical shape, a bulky shape, a needle shape, a flake shape, an approximately spherical shape, and an aggregate thereof. Among these, the preferred shape of the micro copper particles is a flake shape. That is, the micro copper particles preferably include flake-shaped micro copper particles. The micro copper particles may include flake-shaped micro copper particles in an amount of 50% by mass or more, 70% by mass or more, 80% by mass or more, or 100% by mass.

By using flake-shaped micro copper particles, the micro copper particles in the joining material are oriented in approximately parallel to a joining surface, and thus the volume shrinkage in a joining surface direction when the joining material is sintered can be suppressed and it is easy to secure the joining strength of the joined body to be produced by sintering the joining material. In the case of using the joining material in joining of microdevices, the microdevices tend to exhibit satisfactory die shear strength and connection reliability. From the viewpoint of further exhibiting the effect, the aspect ratio of the flake-shaped micro copper particles is preferably 3.0 or more, more preferably 4.0 or more, and further preferably 6.0 or more.

The maximum particle size and the average maximum particle size of the flake-shaped micro copper particles may be 2.0 to 50 µm, 3.0 to 50 or 3.0 to 20 µm. The maximum particle size and the average maximum particle size of the flake-shaped micro copper particles can be obtained, for example, from SEM images of the particles. The maximum particle size and the average maximum particle size of the flake-shaped micro copper particles are obtained, for example, as a major axis X and an average value Xav of the major axis of the flake-shaped micro copper particles. The major axis X is a distance of two parallel planes that are selected so that the distance between two parallel planes is the largest among two parallel planes circumscribing the flake-shaped micro copper particles in the three-dimensional shape of the flake-shaped micro copper particles.

In the micro copper particles, there is no particular limitation as to whether or not to perform a treatment with the surface treatment agent. From the viewpoints of dispersion stability and oxidation resistance, the micro copper particles may be treated with a surface treatment agent. That is, the micro copper particles may have a compound derived from a surface treatment agent. The surface treatment agent may be adsorbed on the surface of the micro copper particles by a hydrogen bond or the like, or may react with the micro copper particles to bond to the surface of the micro copper particles.

The surface treatment agent may be removed by heating during joining. Examples of such a surface treatment agent include aliphatic carboxylic acids such as dodecanoic acid, palmitic acid, heptadecanoic acid, stearic acid, arachidic acid, linolic acid, linoleic acid, and oleic acid; aromatic carboxylic acids such as terephthalic acid, pyromellitic acid, and o-phenoxybenzoic acid; aliphatic alcohols such as cetyl alcohol, stearyl alcohol, isobornyl cyclohexanol, and tetraethylene glycol; aromatic alcohols such as p-phenyl phenol; alkylamines such as octylamine, dodecylamine, and stearylamine; aliphatic nitriles such as stearonitrile and decanenitrile; silane coupling agents such as alkylalkoxysilane; and polymer treatment agents such as polyethylene glycol, polyvinyl alcohol, polyvinyl pyrrolidone, and silicone oligomer. The surface treatment agent may be used alone or in combination of two or more kinds thereof.

As the micro copper particles, commercially available micro copper particles can be used. Examples of materials containing commercially available micro copper particles include MA-C025KFD (manufactured by MITSUI MINING & SMELTING CO., LTD., volume average particle size: 7.5 µm), 3L3 (manufactured by Fukuda Metal Foil & Powder Co., Ltd., volume average particle size: 8.0 µm), 2L3N (manufactured by Fukuda Metal Foil & Powder Co., Ltd., volume average particle size: 9.9 µm), and 1110F (manufactured by MITSUI MINING & SMELTING CO., LTD., volume average particle size: 3.8 µm).

The content of the micro copper particles is preferably 10 to 50% by mass, more preferably 15 to 45% by mass, and further preferably 20 to 40% by mass on the basis of the total mass of the metal particles. The content of the micro copper particles may be 10% by mass or more, 15% by mass or more, or 20% by mass or more on the basis of the total mass of the metal particles. The content of the micro copper particles may be 50% by mass or less, 45% by mass or less, or 40% by mass or less on the basis of the total mass of the metal particles. When the content of the micro copper particles is within the above range, peeling of the joint (for example, the sintered body) and occurrence of voids and cracks can be suppressed to secure the joining strength. In the case of using the joining material in joining of microdevices, the microdevices tend to exhibit satisfactory die shear strength and connection reliability. The content of the flake-shaped micro copper particles may be the same as the range of the content of the micro copper particles described above. When the content of the flake-shaped micro copper particles is within such a range, the above effects tend to be further exhibited. The content does not include the amount of the surface treatment agent. The total mass of the metal particles does not include the amount of the surface treatment agent adsorbed on the surface of the metal particles.

The total of the content of the sub-micro copper particles and the content of the micro copper particles may be 80 to 100% by mass on the basis of the total mass of the metal particles. When the total of the content of the sub-micro copper particles and the content of the micro copper particles is within the above range, the volume shrinkage when the joining material is sintered can be sufficiently reduced, and thus the joining strength of the joined body to be produced by sintering the joining material is easily secured. In the case of using the joining material in joining of microdevices, the microdevices tend to exhibit satisfactory die shear strength and connection reliability. From the viewpoint of further exhibiting the effect, the total of the content of the sub-micro copper particles and the content of the micro copper particles may be 90% by mass or more, 95% by mass or more, or 100% by mass on the basis of the total mass of the metal particles. The content does not include the amount of the surface treatment agent. The total mass of the metal particles does not include the amount of the surface treatment agent adsorbed on the surface of the metal particles.

[Other Metal Particles]

Examples of the metal particles other than the sub-micro copper particles and the micro copper particles include copper nanoparticles and particles of nickel, silver, gold, palladium, platinum, and the like. The volume average particle size of the other metal particles may be 0.01 to 10 μm, 0.01 to 5 μm, or 0.05 to 3 μm. The shape of the other metal particles is not particularly limited. The content of the other metal particles may be less than 20% by mass, 10% by mass or less, or 0% by mass on the basis of the total mass of the metal particles, from the viewpoint of obtaining sufficient joining properties.

In the case of using metal particles made of metallic species having a low melting point as the other metal particles, the effect of reducing the sintering temperature tends to be obtainable. Further, a sintered body in which a plurality of kinds of metals are solid-solved or dispersed can be obtained. For this reason, mechanical characteristics such as a yield stress and fatigue strength of the sintered body are improved, and thus connection reliability is easily improved. Further, by adding a plurality of kinds of metal particles, the sintered body of the joining material can have a sufficient joining strength with respect to a specific adherend. In the case of using the joining material in joining of microdevices, die shear strength and connection reliability of the microdevices are easily improved.

(Organic Compound)

The organic compound has, for example, a function of forming the joining material into a paste and a function of temporarily fixing both members more stably until the first member and the second member are completely joined. When the temperature of the joining material reaches the sintering temperature in the second step, the organic compound remains in 1% by mass or more on the basis of the total mass of the joining material. For example, the organic compound includes an organic compound which can remain in 1% by mass or more on the basis of the total mass of the joining material when the temperature of the joining material reaches the sintering temperature in the second step. Examples of such an organic compound include an organic solvent having a boiling point of 300° C. or higher (hereinafter, also referred to as "first organic solvent") and a thermally decomposable resin of which a 5% by weight reduction temperature in a reducing atmosphere is 100° C. or higher (hereinafter, also referred to as "first thermally decomposable resin"). In the present specification, the organic solvent means an organic compound functioning as a dispersion medium for metal particles and the thermally decomposable resin means a resin that decomposes by heat.

[Organic Solvent]

The boiling point of the first organic solvent is 300° C. or higher. Therefore, it is considered that the first organic solvent remains in the joining material up to the sintering temperature (for example, 150 to 300° C.) and adhesiveness and flexibility are imparted to the joining material. From the viewpoint of further exhibiting the effect, the boiling point of the first organic solvent is preferably 310° C. or higher. The boiling point of the first organic solvent is preferably 450° C. or lower and more preferably 400° C. or lower. The organic solvent is volatilized and removed by vapor pressure thereof even at a temperature equal to or lower than the boiling point. When the sintering temperature is, for example, 150 to 300° C., the solvent having a boiling point of 450° C. or lower is rapidly removed at a sufficient volatilization rate after the temperature reaches the sintering temperature and hardly remains in the joining material. As a result, the sintering is not hindered by the organic solvent remaining in the joining material, and the first member and the second member can be joined in a good joined state. From these viewpoints, the boiling point of the organic solvent having a boiling point of 300° C. or higher may be 300 to 450° C., 300 to 400° C., 310 to 450° C., or 310 to 400° C.

Examples of the first organic solvent include a monohydric alcohol compound, a polyhydric alcohol compound, an ether compound, an ester compound, an acid amide compound, an aliphatic hydrocarbon compound, an aromatic hydrocarbon compound, a mercaptan compound, and a nitrile compound. The first organic solvent may be used alone or in combination of plural kinds thereof.

The first organic solvent preferably has a structure having a high affinity with the surface of the metal particles (for example, a surface treatment agent that the metal particles have on the surface) in order to improve dispersibility of the metal particles in the joining material. For example, in a case where the metal particles are surface-treated with a surface treatment agent having an alkyl group, an organic solvent having an alkyl group or an alkylene group is preferably used. The alkyl group may be linear or branched. The number of carbon atoms of the alkyl group may be, for example, 4 or more and 30 or less.

Examples of the organic solvent having an alkyl group or an alkylene group include alkyl alcohols such as isobornyl cyclohexanol (for example, "MTPH" manufactured by Nippon Terpene Chemicals, Inc.), isooctadecanol (for example, "FINEOXOCOL 180" and "FINEOXOCOL 180T" manufactured by Nissan Chemical Corporation), 1-hexadecanol (cetyl alcohol), 2-hexadecanol (for example, "FINEOXOCOL 1600" manufactured by Nissan Chemical Corporation), and 9-octadecenol (oleyl alcohol); alkyl ethers and alkyl esters such as octyl octanoate, methyl myristate, ethyl myristate, methyl linoleate, methyl stearate, butyl stearate (for example, "EXCEPARL BS" manufactured by Kao Corporation), stearyl stearate (for example, "EXCEPARL SS" manufactured by Kao Corporation), 2-ethylhexyl stearate (for example, "EXCEPARL EH-S" manufactured by Kao Corporation), isotridecyl stearate (for example, "EXCEPARL TD-S" manufactured by Kao Corporation), tetraethylene glycol, triethylene glycol bis(2-ethyl hexanoate), tributyl citrate, dibutyl sebacate, and tributyrin; alicyclic hydrocarbon compounds such as heptadecane, octadecane, nonadecane, eicosane, heneicosane, docosane, methyl heptadecane, tridecyl cyclohexane, tetradecyl cyclohexane, pentadecyl cyclohexane, and hexadecyl cyclohexane; alkyl group or alkylene group-containing aromatic compounds such as undecyl benzene, dodecyl benzene, tetradecyl benzene, tridecyl benzene, pentadecyl benzene, hexadecyl benzene, heptadecyl benzene, nonyl naphthalene, diphenyl propane, pentyl phenol, benzyl phenol, 2-(4-methoxyphenyl) ethanol (methoxyphenethyl alcohol), and benzyl benzoate; alkyl nitrile such as hexadecanenitrile or heptadecanenitrile; and cinmethylin.

From the viewpoint of easily imparting flexibility to the joining material and the viewpoint of easily obtaining the boiling point in the above range, the molecular weight of the first organic solvent may be 180 or more, 190 or more, or 200 or more. From the viewpoint of easily obtaining the boiling point in the above range, the molecular weight of the first organic solvent may be 800 or less, 700 or less, 600 or less. From these viewpoints, the molecular weight of the first organic solvent may be 180 to 800, 190 to 700, or 200 to 600.

From the viewpoints that the condition of Formula (I) is easily satisfied and occurrence of destruction and peeling of the joint can be further suppressed, the content of the first organic solvent may be 1.0% by mass or more, 2.0% by mass or more, or 2.4% by mass or more on the basis of the total mass of the joining material. From the viewpoint of excellent sinterability of the joining material, the content of the first organic solvent may be 20.0% by mass or less, 16.0% by mass or less, or 13.0% by mass or less on the basis of the total mass of the joining material. From these viewpoints, the content of the first organic solvent may be 1.0 to 20.0% by mass, 2.0 to 16.0% by mass, or 2.4 to 13.0% by mass on the basis of the total mass of the joining material.

The content of the first organic solvent is not limited to the above range. The content of the first organic solvent can be set according to the sintering temperature and the boiling point of the organic solvent such that the organic compound remains in 1% by mass or more on the basis of the total mass of the joining material when the temperature of the joining material reaches the sintering temperature in the second step. For example, in a case where the sintering temperature is 150 to 300° C. and the boiling point of the first organic solvent is 300 to 450° C., from the viewpoints that the condition of Formula (I) is easily satisfied and occurrence of destruction and peeling of the joint can be further suppressed, the content of the organic solvent may be 1.0% by mass or more, 1.5% by mass or more, or 2.0% by mass or more on the basis of the total mass of the joining material, and from the viewpoint of excellent sinterability of the joining material, the content of the organic solvent may be 13.0% by mass or less, 11.0% by mass or less, or 9.0% by mass or less on the basis of the total mass of the joining material. From these viewpoints, in a case where the sintering temperature is 150 to 300° C. and the boiling point of the first organic solvent is 300 to 450° C., the content of the organic solvent may be 1.0 to 13.0% by mass, 1.5 to 11.0% by mass, or 2.0 to 9.0% by mass on the basis of the total mass of the joining material.

The joining material may contain an organic solvent having a boiling point of lower than 300° C. (hereinafter, also referred to as "second organic solvent"). In a case where the joining material includes the second organic solvent, while dispersibility of the metal particles and solubility of the thermally decomposable resin are secured, the organic solvent is easily removed without remaining after the temperature reaches the sintering temperature. The second organic solvent may be used alone or in combination of plural kinds thereof.

Examples of the second organic solvent include α-terpineol, diethylene glycol monobutyl ether, diethylene glycol monobutyl ether acetate, 4-methyl-1,3-dioxolan-2-one, diethylene glycol monobutyl ether. The second organic solvent can be easily removed in a drying step before sintering in the second step or while raising temperature.

From the viewpoint of properly adjusting the content of the first organic solvent, the content of the second organic solvent may be 1.0% by mass or more, 1.5% by mass or more, or 2.0% by mass or more on the basis of the total mass of the joining material. From the viewpoint of the balance between securing of the joining strength and applicability, the content of the second organic solvent may be 18.0% by mass or less, 14.0% by mass or less, or 11.0% by mass or less on the basis of the total mass of the joining material. The content of the second organic solvent may be 0% by mass on the basis of the total mass of the joining material. That is, the joining material may not contain the second organic solvent.

When the joining material contains the first organic solvent and the second organic solvent, the ratio of the content of the second organic solvent to the content of the first organic solvent ([the content of the second organic solvent]/[the content of the first organic solvent]) may be 0.1 or more, 0.3 or more, or 0.5 or more from the viewpoint of excellent sinterability of the joining material. The ratio of the content of the second organic solvent to the content of the first organic solvent may be 10.0 or less, 7.0 or less, 5.0 or less, less than 1.0, or 0.8 or less from the viewpoints that the condition of Formula (I) is easily satisfied and occurrence of destruction and peeling of the joint can be further suppressed. From these viewpoints, the ratio of the content of the second organic solvent to the content of the first organic solvent may be 0.1 to 10.0, 0.3 to 7.0, or 0.5 to 5.0.

The content of the organic solvent (the total of the content of the first organic solvent and the content of the second organic solvent) may be 5 parts by mass or more with respect to 100 parts by mass of the metal particles from the viewpoint of dispersibility of the metal particles and the viewpoint of easily adjusting the joining material to have a more appropriate viscosity. The content of the organic solvent may be 50 parts by mass or less with respect to 100 parts by mass of the metal particles from the viewpoint of easily adjusting the joining material to have a more appropriate viscosity and the viewpoint of having more excellent sinterability of the metal particles. From these viewpoints, the content of the organic solvent may be 5 to 50 parts by mass with respect to 100 parts by mass of the metal particles.

In the case of performing a drying step described later, it is particularly preferable that the content of the organic solvent (the content of the first organic solvent, the content of the second organic solvent, and the total thereof) and the ratio of the content of the second organic solvent to the content of the first organic solvent are such that the contents in the joining material after the drying step fall within the above range.

The type and content of the organic solvent mentioned above can be analyzed, for example, with a gas chromatograph-mass analysis method of high-temperature desorption gas and TOF-SIMS. As other analysis methods, a method of identifying a supernatant, which is obtained by separating a particle component with centrifugal separation, by general organic analysis (for example, FT-IR, NMR, liquid chromatography, and a combination thereof) is exemplified. In a case where a plurality of organic solvents are contained, the ratio of the plurality of organic solvents can be quantitatively determined with liquid chromatography, NMR, and the like.

[Thermally Decomposable Resin]

The 5% by weigh reduction temperature of the first thermally decomposable resin in a reducing atmosphere (for example, in a reducing gas atmosphere containing hydrogen, formic acid, and the like) (hereinafter, also referred to as "5% by weight reduction temperature") is 100° C. or higher. Therefore, it is considered that a certain amount or more of the first thermally decomposable resin remains in the joining material up to the sintering temperature (for example, 150 to 300° C.) and adhesiveness and flexibility are imparted to the joining material. The 5% by weight reduction temperature of the first thermally decomposable resin is preferably 150° C. or higher and more preferably 200° C. or higher from the viewpoint of further exhibiting the effect and the viewpoint that the condition of Formula (I) is easily satisfied. The 5% by weight reduction temperature of the first thermally decomposable resin is preferably lower than the sintering temperature from the viewpoint that the condition of Formula (I) is easily satisfied. Specifically, the 5% by weight reduction temperature thereof is preferably 300° C. or lower and more preferably 250° C. or lower. From these viewpoints, the 5% by weight reduction temperature of the first thermally decomposable resin may be 100 to 300° C., 150 to 300° C., 200 to 300° C., 100 to 250° C., 150 to 250° C., or 200 to 250° C. Incidentally, the 5% by weight reduction temperature of the thermally decomposable resin in a reducing atmosphere can be measured by TG/DTA measurement using a thermogravimetric measurement/differential thermal analysis (TG/DTA) device.

The first thermally decomposable resin is preferably a resin that decomposes at a sintering temperature and gasifies without residues. Since no residues (oligomers, carbides, or the like) remain after decomposition, sintering is hardly hindered and satisfactory joining properties are obtainable. For example, based on TG/DTA, the thermally decomposable resin is preferably a compound that loses 95% or more in weight and more preferably a compound that loses 98% or more in weight, in a case where heating is performed up to the sintering temperature of the second step in a reducing atmosphere (for example, in 3 to 5 wt % hydrogen-containing inert gas (nitrogen gas or argon gas) atmosphere) and heating is performed under the condition in which heating is maintained for the sintering time of the second step. That is, the residues in a case where the first thermally decomposable resin is heated under the above conditions are preferably 5% by mass or less and more preferably 2% by mass or less with respect to the mass of the first thermally decomposable resin before heating. Incidentally, in TG/DTA measurement in air, since oxidative decomposition of the thermally decomposable resin proceeds, the amount of residues is smaller than that in the TG/DTA measurement in a reducing atmosphere. Therefore, the measurement needs to be performed in a reducing atmosphere.

The first thermally decomposable resin is preferably a resin having thermoplasticity (thermoplastic resin). That is, the first thermally decomposable resin is preferably not a crosslinkable polymer but a linear or branched polymer. From the viewpoint of temporarily fixing both the members more stably until the first member and the second member are completely joined by sintering of the joining material after application, among thermoplastic resins, a non-crystalline polymer is preferred. The non-crystalline polymer can exhibit more excellent adhesiveness and tackiness. The glass transition temperature of the thermoplastic resin is preferably 200° C. or lower, more preferably 150° C. or lower, and further preferably 100° C. or lower.

The thermally decomposable resin preferably has solubility in the organic solvent. That is, the thermally decomposable resin is preferably a resin that dissolves in an amount of 1.5 g or more with respect to 4.5 g of the organic solvent contained in the joining material.

From the viewpoints of easily obtaining solubility in an organic solvent and the above-described desired characteristics and easily suppressing occurrence of joining failure, the first thermally decomposable resin is preferably at least one selected from the group consisting of polycarbonate, poly(meth)acrylic acid, poly(meth)acrylic acid ester, and polyester and more preferably polycarbonate. Among polycarbonates, poly(alkylene carbonate) such as poly(propylene carbonate), poly(ethylene carbonate), or poly(butylene carbonate) is preferred. The first thermally decomposable resin may be used alone or in combination of plural kinds thereof.

From the viewpoints that the condition of Formula (I) is easily satisfied and occurrence of destruction and peeling of the joint can be further suppressed, the content of the first thermally decomposable resin is 1.0% by mass or more, 1.2% by mass or more, or 2.0% by mass or more on the basis of the total mass of the joining material. From the viewpoint of excellent sinterability of the joining material, the content of the first thermally decomposable resin is 20.0% by mass or less, 18.0% by mass or less, or 15.0% by mass or less on the basis of the total mass of the joining material. From these viewpoints, the content of the first thermally decomposable resin may be 1.0 to 20.0% by mass, 1.2 to 18.0% by mass, or 2.0 to 15.0% by mass on the basis of the total mass of the joining material.

In the present embodiment, from the viewpoints that the condition of Formula (I) is easily satisfied and occurrence of destruction and peeling of the joint can be further suppressed, the total of the content of the first organic solvent and the content of the first thermally decomposable resin may be 1.0% by mass or more, 3.0% by mass or more, or 5.0% by mass or more on the basis of the total mass of the joining material. From the viewpoint of excellent sinterability of the joining material, the total of the content of the first organic solvent and the content of the first thermally decomposable resin may be 20.0% by mass or less, 18.0% by mass or less, or 15.0% by mass or less on the basis of the total mass of the joining material. From these viewpoints, the total of the content of the first organic solvent and the content of the first thermally decomposable resin may be 1.0 to 20.0% by mass, 3.0 to 18.0% by mass, or 5.0 to 15.0% by mass on the basis of the total mass of the joining material.

The joining material may contain a second thermally decomposable resin of which a 5% by weight reduction temperature in a reducing atmosphere is lower than 100° C. The content of the second thermally decomposable resin can be appropriately adjusted within a range not impairing the effects of the present invention.

In the case of performing a drying step described later, it is particularly preferable that the content of the first thermally decomposable resin and the total of the content of the first organic solvent and the content of the first thermally decomposable resin are such that the contents in the joining material after the drying step fall within the above range.

(Other Components)

The joining material may further contain, as additives, other components other than the metal particles, the surface treatment agent, the organic solvent, and the thermally decomposable resin (for example, organic compounds other than the surface treatment agent, the organic solvent, and the thermally decomposable resin). Examples of the additives include wetting improvers such as a nonionic surfactant and a fluorine-based surfactant; a surface-tension modifier; dispersants such as alkylamine and alkylcarboxylic acid; antifoaming agents such as silicone oil; and ion trapping agents such as an inorganic ion exchanger. The content of the additive can be appropriately adjusted within a range not impairing the effects of the present invention.

The viscosity of the joining material mentioned above is not particularly limited, and in the case of molding by means such as printing or coating, the viscosity thereof may be adjusted to a viscosity suitable for a molding method. The Casson viscosity at 25° C. of the joining material may be 0.05 Pa·s or more or 0.06 Pa·s or more. The Casson viscosity at 25° C. of the joining material may be 2.0 Pa·s or less or 1.0 Pa·s or less. The Casson viscosity at 25° C. of the joining material may be 0.05 to 2.0 Pa·s or 0.06 to 1.0 Pa·s.

<Method for Preparing Joining Material>

The aforementioned joining material can be prepared by mixing the metal particles, the organic compound, and optional components (additives or the like). For example, in the case of using the thermally decomposable resin and the organic solvent, the joining material may be prepared by dissolving the thermally decomposable resin in the organic solvent, then adding the metal particles (for example, sub-micro copper particles, micro copper particles, other metal particles, or the like) and an optional additive to the obtained solution, and performing a dispersion treatment. Further, the joining material may be prepared by mixing a solution, which is obtained by dissolving the thermally decomposable resin in the organic solvent, and a dispersion liquid, which is obtained by mixing the metal particles (for example, copper particles) with the organic solvent and performing a dispersion treatment. At this time, in the case of using a plurality of kinds of metal particles, a plurality of dispersion liquids may be prepared and mixed, or other metal particles may be added to a solution containing a thermally decomposable resin or a mixed solution of a solution containing a thermally decomposable resin and a dispersion liquid containing metal particles. Further, in the case of using an optional additive, the additive may be added to a solution containing a thermally decomposable resin, a dispersion liquid containing metal particles, or a mixed solution of a solution containing a thermally decomposable resin and a dispersion liquid containing metal particles.

In the case of using sub-micro copper particles and micro copper particles as the metal particles, the joining material may be prepared, for example, by the following method. First, a dispersant is added as necessary to at least one of the organic solvent and the thermally decomposable resin, the sub-micro copper particles are mixed, and then the dispersion treatment is performed. Next, the micro copper particles, and as necessary, other metal particles are added and the dispersion treatment is performed. In the sub-micro copper particles and the micro copper particles, dispersion methods and dispersion conditions suitable for dispersion may be different. In general, the sub-micro copper particles are more difficult to disperse than the micro copper particles, and in order to disperse the sub-micro copper particles, a higher strength than a strength applied when the micro copper particles are dispersed is required. On the other hand, the micro copper particles are not only easy to disperse, but also may deform when a high strength is applied to disperse the micro copper particles. Therefore, with the procedure as described above, satisfactory dispersibility is easily obtainable and the performance of the joining material can be further improved.

The dispersion treatment can be performed using a disperser or a stirrer. Examples of the disperser and the stirrer include an Ishikawa type stirrer, a Silverson stirrer, a cavitation stirrer, a rotation and revolution type stirrer, an ultra-thin film high-speed rotation type disperser, an ultrasonic disperser, a Raikai mixer, a biaxial kneader, a bead mill, a ball mill, a three-roll mill, a homomixer, a planetary mixer, an ultrahigh-pressure type disperser, and a thin layer shear disperser.

In preparation of the joining material, the dispersion liquid containing metal particles may be subjected to a classification operation to remove an aggregate. Further, the maximum particle size of the dispersion liquid may be adjusted by the classification operation. At this time, the maximum particle size of the dispersion liquid can be set to 20 μm or less, and can also be set to 10 μm or less. The classification operation can be performed, for example, by filtration, spontaneous precipitation, and centrifugal separation. Examples of a filter for filtration include a water comb, a metal mesh, a metal filter, and a nylon mesh.

In preparation of the joining material, a stirring treatment may be performed after the respective components are mixed. The stirring treatment can be performed using a stirrer. Examples of the stirrer include an Ishikawa type stirrer, a rotation and revolution type stirrer, a Raikai mixer, a biaxial kneader, a three-roll mill, and a planetary mixer.

<Method for Producing Joined Body>

Figure 2:
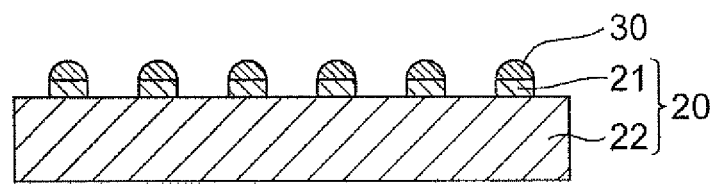
FIG. 2 is a schematic cross-sectional view for describing a first step in the method for producing a joined body.
Figure 2:
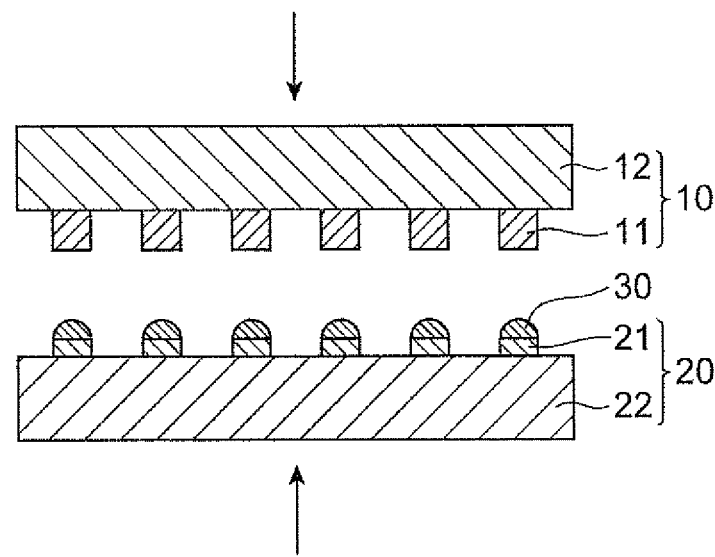
Figure 2:
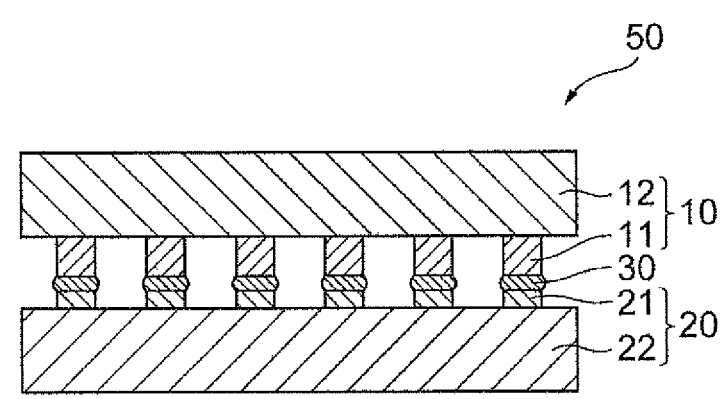
Figure 3:
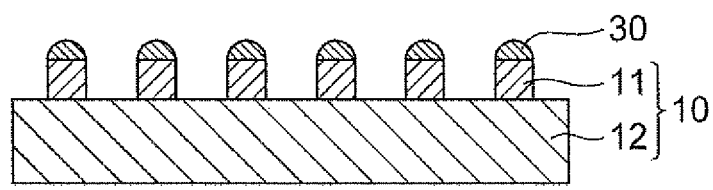
FIG. 3 is a schematic cross-sectional view for describing the first step in the method for producing a joined body.
Figure 3:
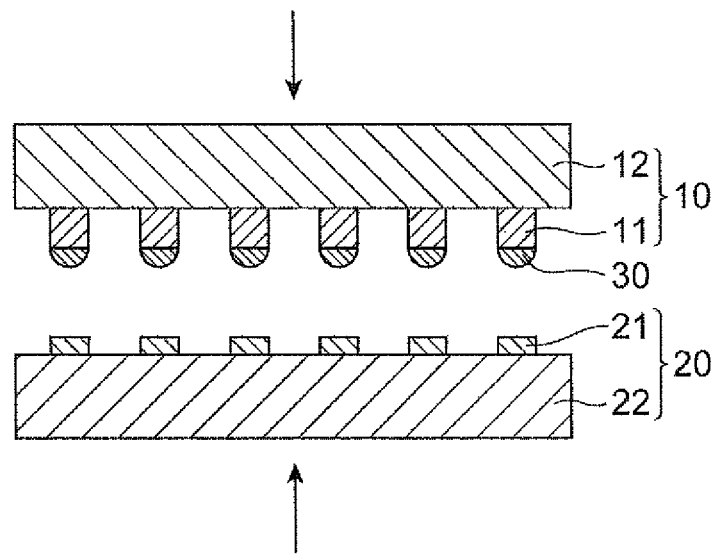
Figure 3:
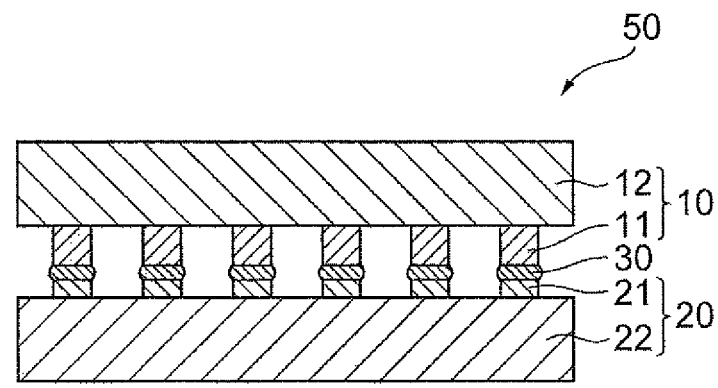

Next, each step of the method for producing a joined body of the present embodiment will be described with reference to the drawings. FIG. 1 is a schematic cross-sectional view illustrating a method for producing a joined body of an embodiment. FIG. 2 and FIG. 3 are schematic cross-sectional views illustrating an example of the first step.

(First Step)

In the first step, a laminated body 50, which includes a first member 10, a second member 20, and a joining material (joint) 30, is prepared (see FIG. 1(a)).

The first member 10 includes a metal pillar 11 and a substrate (first substrate) 12 on which the metal pillar 11 is provided on one surface. The first member 10 is, for example, a microdevice such as a logic, an analog IC, or a power IC.

A plurality of the metal pillars 11 are provided, for example, on one surface of the first substrate 12, and when the first member 10 and the second member 20 are disposed to face each other, each of the plurality of the metal pillars 11 are disposed on the first substrate 12 to face the electrode pad 21 in the second member 20.

The material of the metal pillar 11 is not particularly limited. In a case where an oxide film is formed on the joining surface of the metal pillar 11 (the surface on which the joining material 30 is disposed, the surface opposite to the first substrate 12), from the viewpoint of easily removing the oxide film in the second step, at least the joining surface of the metal pillar 11 is preferably made of at least one metal selected from the group consisting of gold, platinum, silver, palladium, copper, nickel, and zinc. In addition, from the viewpoints of suppressing Kirkendall voids after joining and suppressing impedance mismatch, at least the joining surface of the metal pillar 11 is preferably made of a material containing copper and more preferably made of a material containing copper at a certain ratio (for example, 90% by mass or more).

The shape of the metal pillar 11 is not particularly limited. The shape of the cross-section perpendicular to the direction in which the metal pillar 11 extends may be, for example, a circular shape, an elliptical shape, a rectangular shape, or the like. The height of the metal pillar 11 may be, for example, 10 μm or more or 100 μm or less. The pillar diameter of the metal pillar 11 (the maximum diameter in the case of the cross-section being a shape other than a circular shape) may be, for example, 10 μm or more or 300 μm or less.

The second member 20 includes the electrode pad 21 and a substrate (second substrate) 22 on which the electrode pad 21 is provided on one surface. The second member 20 is, for example, a substrate such as a mounting substrate, a lead frame, a high heat dissipation mounting substrate, a silicon interposer, or an epoxy wiring board.

The shape and material of the electrode pad 21 are not particularly limited. In a case where an oxide film is formed on the joining surface of the electrode pad 21 (the surface on which the joining material 30 is disposed, the surface opposite to the second substrate 22), from the viewpoint of easily removing the oxide film in the second step, at least the joining surface of the electrode pad 21 is preferably made of at least one metal selected from the group consisting of gold, platinum, silver, palladium, copper, nickel, and zinc. In addition, from the viewpoints of suppressing Kirkendall voids after joining and suppressing impedance mismatch, at least the joining surface of the electrode pad 21 is preferably made of a material containing copper and more preferably made of a material containing copper at a certain ratio (for example, 90% by mass or more). The material (metal) constituting the metal pillar 11 and the electrode pad 21 may be the same or different.

The joining material 30 forms a joint between the metal pillar 11 and the electrode pad 21. In FIG. 1, the joining material 30 exists only between the metal pillar 11 and the electrode pad 21, but the disposition location of the joining material 30 is not limited thereto. That is, the joining material 30 exist at least between the metal pillar 11 and the electrode pad 21 and may also exist in a region other than the region between the metal pillar 11 and the electrode pad 21.

The thickness of the joint in the laminated body 50 (the distance from the joining surface of the metal pillar 11 to the joining surface of the electrode pad 21) may be 1 to 1000 µm, 5 to 500 µm, 10 to 500 µm, 15 to 500 µm, 20 to 300 µm, 50 to 200 µm, 10 to 3000 µm, 10 to 250 µm, or 15 to 150 µm. The thickness of the joint may be 1 µm or more, 5 µm or more, 10 µm or more, 15 µm or more, 20 µm or more, or 50 µm or more. The thickness of the joint may be 3000 µm or less, 1000 µm or less, 500 µm or less, 300 µm or less, 250 µm or less, 200 µm or less, or 150 µm or less.

The laminated body 50 can be obtained, for example, by disposing the joining material 30 on at least one joining surface of the metal pillar 11 in the first member 10 and the electrode pad 21 in the second member 20 and then connecting the metal pillar 11 of the first member 10 and the electrode pad 21 of the second member 20 through the joining material 30. For example, as illustrated in FIG. 2, the laminated body 50 may be obtained by disposing the joining material 30 on the joining surface of the electrode pad 21 in the second member 20 (see FIG. 2(a)), then disposing the first member 10 on the second member 20 such that the metal pillar 11 and the electrode pad 21 face each other through the joining material 30 (see FIG. 2(b)), and connecting the metal pillar 11 and the electrode pad 21 through the joining material 30 (see FIG. 2(c)). As illustrated in FIG. 3, the laminated body 50 may be obtained by disposing the joining material 30 on the joining surface of the metal pillar 11 in the first member 10 (see FIG. 3(a)), then disposing the second member 20 on the first member 10 such that the metal pillar 11 and the electrode pad 21 face each other through the joining material 30 (see FIG. 3(b)), and connecting the metal pillar 11 and the electrode pad 21 (see FIG. 3(c)). The joining material 30 may be disposed on at least a part of the joining surface of the metal pillar 11 and the electrode pad 21 or may be disposed on the entire joining surface.

As the method of disposing the joining material 30 on the joining surface of the metal pillar 11 and the electrode pad 21, a method capable of attaching the joining material 30 to the joining surface (end surface) of the metal pillar 11 and the joining surface of the electrode pad 21 is sufficient and a known method can be employed.

Specific examples of the method of disposing the joining material 30 on the joining surface of the metal pillar 11 include a method of dipping the joining surface of the metal pillar 11 on the joining material 30 thinly and uniformly stretched with a squeegee or the like, a method of transferring the joining material 30 to the joining surface of the metal pillar 11 by a roller onto which the joining material 30 is thinly and uniformly applied, and a method of printing the joining material 30 on the joining surface of the metal pillar 11 by a needle dispenser.

Specific examples of the method of disposing the joining material 30 on the joining surface of the electrode pad 21 include a method by printing such as screen printing, transfer printing, offset printing, anastatic printing, intaglio printing, gravure printing, stencil printing, or jet printing, a method using a dispenser (for example, a jet dispenser or a needle dispenser), a comma coater, a slit coater, a die coater, a gravure coater, a slit coater, a bar coater, an applicator, a spray coater, a spin coater, or a dip coater, a method by soft lithography, a particle deposition method, and a method by electrodeposition coating.

As the method of laminating the first member (for example, a microdevice) and the second member (for example, a substrate), for example, a method using a chip mounter, a flip-chip bonder, a carbon or ceramic positioning jig, or the like is exemplified.

The joining material 30 disposed between the first member and the second member (between the metal pillar 11 and the electrode pad 21) may be dried from the viewpoint of suppressing the flow and occurrence of voids during sintering. That is, the production method of the present embodiment may further include a drying step of drying the joining material 30 after the first step and before the second step.

Drying may be performed in air, in an oxygen-free atmosphere of nitrogen, rare gas, or the like, or in a reducing atmosphere of hydrogen, formic acid, or the like. In a drying method, drying may be performed after being left to stand at normal temperature (for example, 25° C.), heating drying may be performed, or drying under reduced pressure may be performed. In drying by heating or drying under reduced pressure, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, a hot-plate press apparatus, and the like can be used. Drying conditions (drying temperature and drying time) may be appropriately set according to the type and amount of the volatile component used in the joining material (for example, components other than metal particles, such as an organic solvent and a thermally decomposable resin), and for example, the drying conditions may be adjusted so that the contents of the organic solvent and the thermally decomposable resin in the joining material 30 after drying become the above content. The drying conditions (drying temperature and drying time) may be, for example, conditions of drying at 50° C. or higher and lower than 150° C. for 1 to 120 minutes.

(Second Step)

In the second step, the laminated body 50 is heated to sinter the joining material 30 at a predetermined sintering temperature, thereby obtaining the sintered body 31. According to this, a joined body 100, which includes the first member 10, the second member 20, and the sintered body (joint) 31 provided between the metal pillar 11 and the electrode pad 21, is obtained (see FIG. 1(b)). In the joined body 100, the metal pillar 11 and the electrode pad 21 are electrically connected by the sintered body 31.

In the heating treatment, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, and the like can be used.

The sintering temperature (the highest temperature reached during the heating treatment) may be 150 to 300° C., 170 to 250° C., or 200 to 250° C. from the viewpoint of sufficiently performing sintering, the viewpoint of reducing thermal damage to the first member (for example, a microdevice) and the second member (for example, a substrate), the viewpoint of improving a yield, and the viewpoints that the condition of Formula (I) is easily satisfied and occurrence of joining failure can be further suppressed. The sintering temperature may be 150° C. or higher, 170° C. or higher, or 200° C. or higher. The sintering temperature may be 300° C. or lower or 250° C. or lower. When the sintering temperature is 300° C. or lower, sintering can be sufficiently performed with less thermal damage to the first member and the second member, and a sufficient joining strength tends to be obtainable. When the sintering temperature is 150° C. or higher, even in the case of the sintering time of 60 minutes or shorter, sintering tends to be sufficiently performed. Even when the sintering temperature is lower than 150° C., by setting the sintering time to longer than 60 minutes, sintering can be sufficiently performed. In order to improve reliability in reliability tests such as a temperature cycle test and a power cycle test, the heating treatment can also be performed under the condition of 300° C. or higher.

The sintering time (retention time at the highest temperature reached) may be 1 minute or longer, 1.5 minutes or longer, or 2 minutes or longer from the viewpoints that volatile components (for example, components other than the metal particles, such as an organic solvent and a thermally decomposable resin) are sufficiently removed and sintering can be sufficiently performed. The sintering time may be 60 minutes or shorter, shorter than 40 minutes, or shorter than 30 minutes from the viewpoint of improving a yield. From these viewpoints, the sintering time may be 1 to 60 minutes, 1 minute or longer and shorter than 40 minutes, or 1 minute or longer and shorter than 30 minutes. In particular, when the sintering temperature is 150 to 300° C., the sintering time is preferably within the above range.

The atmosphere in which the laminated body 50 is heated in the second step may be a reducing atmosphere (reducing gas atmosphere) from the viewpoint that, in a case where metal oxide is present on the surface of the metal particles (for example, copper particles) in the joining material 30 and the surfaces (joining surfaces) of the metal pillar 11 and the electrode pad 21, the metal oxide can be satisfactorily removed. Examples of the reducing atmosphere include pure hydrogen gas atmosphere, a mixed gas atmosphere of hydrogen and nitrogen that are represented by forming gas, a nitrogen atmosphere containing formic acid gas, a mixed gas atmosphere of hydrogen and rare gas, and a rare gas atmosphere containing formic acid gas.

The second step may be performed under pressure. From the viewpoint of improving mass productivity and improving long-term reliability, the second step is preferably performed with a pressure of 0.1 MPa or less applied in addition to the pressure by the weight of the members laminated on the joining material and more preferably performed without pressurization (under the pressure only by the weight of the members laminated on the joining material). In the present embodiment, since the joining material 30 is used, even in the case of performing joining without pressurization when the joining material 30 (the laminated body 50) is sintered in the second step, the joined body can have a sufficient joining strength. That is, it is possible to obtain a sufficient joining strength even in the case of perforating the second step in a state of receiving the pressure by the weight of the member (for example, a microdevice) laminated on the joining material or in a state of receiving the pressure by the weight of the member and a pressure of 0.1 MPa or less, and preferably 0.01 MPa or less. In a case where the pressure received during sintering is within the above range, a particular pressurizing apparatus is not necessary, and thus voids can be reduced without deterioration in a yield and die shear strength and connection reliability can be further improved. Examples of a method in which the joining material receives a pressure of 0.01 MPa or less include a method in which a weight is placed on the member (for example, the first member) disposed on the upper side in the vertical direction and a method of applying a pressure with a spring jig.

As described above, in the present embodiment, the joining material 30 can satisfy Formula (I), for example, by adjusting the type, content, and the like of the organic compound in the joining material or adjusting the heating conditions in the drying step and the second step. Further, in the present embodiment, when the joining material 30 satisfies Formula (I), even in the case of reducing a pressure applied during joining, joining failure hardly occurs, damage to members to be joined can be reduced, and effects such as simplification of a process, simplification of a joining apparatus, and improvement in a production yield can be obtained.

Hereinbefore, the method for producing a joined body and the joining material used in the method of the present embodiment have been described, but the present invention is not limited to the above-described embodiment.

For example, in the embodiment, the joined body 100 is obtained by obtaining the laminated body 50 and then heating the laminated body 50 to sinter the joining material 30, but the first step and the second step may be simultaneously performed. That is, the joined body 100 may be obtained by disposing the first member 10 and the second member 20 to face each other through the joining material 30 and then heating the first member 10 and the second member 20 while being laminated through the joining material 30 to sinter the joining material 30.

EXAMPLES

Hereinafter, the present invention will be described in more detail by means of Examples. However, the present invention is not limited to the following Examples. Incidentally, in Examples, a 5% by weight reduction temperature is a value based on TG/DTA measurement in hydrogen.

Example 1

(Preparation of Joining Material (Copper Paste for Joining without Pressurization))

12.32 g (61.6% by mass) of CH-0200 (50% volume average particle size: 0.36 µm, manufactured by MITSUI MINING & SMELTING CO., LTD.) as a material containing sub-micro copper particles, 1.2 g (6.0% by mass) of isobornyl cyclohexanol (boiling point: 308° C., "MTPH" manufactured by Nippon Terpene Chemicals, Inc., hereinafter, abbreviated as "MTPH"), and 1.2 g (6.0% by mass) of terpineol (boiling point: 214° C., manufactured by Wako Pure Chemical Industries, Ltd.) were mixed by a stirrer manufactured by THINKY CORPORATION (trade name: "Awatori Rentaro ARE-310," hereinafter, the same applies) under condition of 2000 rpm and for 1 minute. Thereafter, the dispersion treatment was performed by a three-roll mill 10 times to obtain a mixture.

The mixture obtained by the dispersion treatment was transferred to a polyethylene container, and then 5.28 g (26.4% by mass) of 2L3N (50% volume average particle size: 9.9 μm, aspect ratio: 23, trade name manufactured by Fukuda Metal Foil & Powder Co., Ltd.) was weighed as a material containing micro copper particles and added to the container, and mixed by a stirrer manufactured by THINKY CORPORATION under condition of 2000 rpm and for 1 minute. Thereafter, the dispersion treatment was performed by a three-roll mill 5 times to obtain a joining material.

(First Step: Production of Laminated Body)

The mass of a substrate (WALTS-KIT CC80 Mark II-0201JY) and a chip without solder (WALTS-TEG CC80 Mark II-0101JY STD, Cu pillar diameter: φ25 μm, Cu pillar height: 25 μm) was measured, and then the joining material was subjected to stencil printing on the electrode pad of the substrate by using a stainless steel mask having a thickness of 50 μm. Next, the chip was mounted on the printed matter of the joining material by a flip-chip bonder (FCB3, manufactured by Panasonic Corporation) to obtain a laminated body. The mass of the joining material was obtained by measuring the mass of the laminated body and subtracting the mass of the substrate and the chip from the mass of the laminated body.

(Second Step: Production of Joined Body)

The obtained laminated body was set in a tube oven capable of controlling the atmosphere (manufactured by R-DEC Co., Ltd.) and subjected to the heating treatment in a hydrogen atmosphere. The heating treatment was performed by setting the temperature of the tube oven so that the temperature of the joining material became the sintering temperature, raising the temperature of the joining material from room temperature (25° C.) to the sintering temperature (250° C.) in 15 minutes, and maintaining the joining material at the sintering temperature (250° C.) for 60 minutes. According to this, a joined body was obtained.

(Evaluation of Joining Material)

[Measurement of Mass $M_1$ of Joining Material when Sintering Temperature is Reached]

The laminated body produced in the same manner as in the first step was set in a tube oven capable of controlling the atmosphere (manufactured by R-DEC Co., Ltd.) and subjected to the heating treatment in a hydrogen atmosphere. The heating treatment was performed by setting the temperature of the tube oven so that the temperature of the joining material became the sintering temperature and raising the temperature from room temperature (25° C.) to the sintering temperature (250° C.) in 15 minutes. The laminated body was taken out when the temperature reached the sintering temperature and was rapidly cooled on a brass block. The mass of the laminated body after cooling was measured. The mass $M_1$ of the joining material when the sintering temperature was reached was obtained by subtracting the mass of the substrate and the chip from the mass of the laminated body after cooling.

[Measurement of Non-Volatile Content $M_2$ in Joining Material]

The joining material was put into a magnetic crucible, and the mass of the joining material was obtained from a difference between the tare mass of the magnetic crucible and the mass of the magnetic crucible into which the joining material was put. Next, the magnetic crucible into which the joining material was put was set in a tube oven (manufactured by R-DEC Co., Ltd.) and was maintained at 300° C. for 2 hours in hydrogen after hydrogen substitution under reduced pressure to treat the joining material. The inside of the tube oven was cooled to room temperature, and after air substitution under reduced pressure, the magnetic crucible into which the joining material was put was taken out. The mass of the joining material after the treatment (the non-volatile content in the joining material) was obtained from a difference between the mass of the magnetic crucible after the treatment and the tare mass of the magnetic crucible. The non-volatile content ratio of the joining material was obtained by the following equation, and the non-volatile content $M_2$ in the joining material used in the laminated body was calculated from the obtained non-volatile content ratio and the mass of the joining material used in production of the laminated body.

Non-volatile content ratio (% by mass)=([Non-volatile content in joining material]/[Mass of joining material before heating])×100

(Joined State Evaluation of Joined Body)

[Electrical Conductivity Evaluation]

The conduction at both ends in the daisy chain portion of the joined body was confirmed with a multimeter. A case where conduction can be confirmed was determined as good (A) and a case where conduction cannot be confirmed (the case of disconnection) was determined as poor (B). Incidentally, the above evaluation was performed under the condition of an application voltage of 5 V, and a case where a resistance value is 100Ω or less was determined that there is conduction. The results are shown in Table 1.

[Cross-Section Observation Evaluation]

The joined body was fixed to the inside of a cup with a sample clip (Samplklip I, manufactured by Illinois Tool Works Inc.), and an epoxy casting resin (Epomount, manufactured by Refine Tec Ltd.) was poured to the periphery of the joined body until the entirety of the joined body was embedded. The obtained sample was left to stand still in a vacuum desiccator, and a defoaming treatment was performed by reducing a pressure for 1 minute. Thereafter, the sample was left at room temperature (25° C.) for 10 minutes to cure the epoxy casting resin. According to this, a cured sample was obtained.

The cured sample was cut in the vicinity of a cross-section to be observed by using a resinoid cutting wheel-attached Refine Saw Excel (manufactured by Refine Tec Ltd.). The cross-section was ground by using water-resistant abrasive paper (Carbomac paper, manufactured by Refine Tec Ltd.)-attached polishing apparatus (Refine Polisher HV, manufactured by Refine Tec Ltd.) to expose the joint between the copper pillar and the electrode pad (terminal). Further, the end part protruding from the mask was ground at a CP mode by using an ion milling apparatus (IM4000, manufactured by Hitachi, Ltd.) to expose the cross-section of the joint. The exposed cross-section of the sample thus obtained (the cross-section of the joint of the joined body) was observed using an SEM apparatus (ESEM XL30, manufactured by Koninklijke Philips N.V.) at an application voltage of 10 kV and at various magnifications. A case where the copper pillar and the terminal on the side of the substrate are connected by the sintered body was determined as good (A), and a case where the copper pillar and the terminal on the side of the substrate are not connected due to cracks, peeling, and the like of the joint was determined as poor (B). The results are shown in Table 1.

Examples 2 and 3 and Comparative Example 1

A joining material was prepared in the same manner as in Example 1, except that the ratio of the organic solvent (the amounts of MTPH and terpineol added) was changed to the amount shown in Table 1. A joined body was produced in the same manner as in Example 1 except that the obtained joining material was used, and the evaluation of the joining material and the joined state evaluation of the joined body were performed in the same manner as in Example 1. The results are shown in Table 1.

TABLE 1

| | | | Unit | Example 1 | Example 2 | Example 3 | Comparative Example 1 |
|---|---|---|---|---|---|---|---|
| Joining material | CH-0200 | Ratio to whole metal particles | % by mass | 70.0 | 70.0 | 70.0 | 70.0 |
| | | Content in joining material | % by mass | 61.6 | 61.6 | 61.6 | 61.6 |
| | 2L3N | Ratio to whole metal particles | % by mass | 30.0 | 30.0 | 30.0 | 30.0 |
| | | Content in joining material | % by mass | 26.4 | 26.4 | 26.4 | 26.4 |
| | Terpineol | Boiling point | °C. | 214 | 214 | 214 | 214 |
| | | Content in joining material | % by mass | 6.0 | 8.4 | 10.8 | 11.4 |
| | MTPH | Boiling point | °C. | 318 | 318 | 318 | 318 |
| | | Content in joining material | % by mass | 6.0 | 3.6 | 1.2 | 0.6 |
| $(M_1 - M_2)/M_1 \times 100$ | | | — | 5.17 | 3.36 | 1.21 | 0.64 |
| Drying temperature | | | °C. | — | — | — | — |
| Drying time | | | Minute | — | — | — | — |
| Sintering temperature | | | °C. | 250 | 250 | 250 | 250 |
| Sintering time | | | Minute | 60 | 60 | 60 | 60 |
| Electrical conductivity evaluation | | | — | A | A | A | B |
| Cross-section observation evaluation | | | — | A | A | A | B |

As shown in Table 1, it was confirmed that, in Comparative Example 1 not satisfying the condition of Formula (I), joining failure occurred in joining without pressurization. The reason for this is speculated that the amount of the organic compound (particularly, MTPH) remaining between the metal particles was insufficient and a thermal stress was applied between the joint and the member before the temperature reached the sintering temperature so that the joint was peeled off from the member.

Examples 4 to 6 and Comparative Example 2

The production of the joined body, the evaluation of the joining material, and the joined state evaluation of the joined body were performed in the same manner as in Example 1, except that the drying step was performed under the conditions shown in Table 2 after the first step (production of the laminated body) and before the second step (sintering of the joining material). The results are shown in Table 2.

TABLE 2

| | | | Unit | Example 4 | Example 5 | Example 6 | Comparative Example 2 |
|---|---|---|---|---|---|---|---|
| Joining material | CH-0200 | Ratio to whole metal particles | % by mass | 70.0 | 70.0 | 70.0 | 70.0 |
| | | Content in joining material | % by mass | 61.6 | 61.6 | 61.6 | 61.6 |
| | 2L3N | Ratio to whole metal particles | % by mass | 30.0 | 30.0 | 30.0 | 30.0 |
| | | Content in joining material | % by mass | 26.4 | 26.4 | 26.4 | 26.4 |
| | Terpineol | Boiling point | °C. | 214 | 214 | 214 | 214 |
| | | Content in joining material | % by mass | 6.0 | 6.0 | 6.0 | 6.0 |
| | MTPH | Boiling point | °C. | 318 | 318 | 318 | 318 |
| | | Content in joining material | % by mass | 6.0 | 6.0 | 6.0 | 6.0 |
| $(M_1 - M_2)/M_1 \times 100$ | | | — | 3.93 | 2.98 | 2.00 | 0.68 |
| Drying temperature | | | °C. | 60 | 60 | 60 | 60 |
| Drying time | | | Minute | 10 | 20 | 30 | 60 |
| Sintering temperature | | | °C. | 250 | 250 | 250 | 250 |
| Sintering time | | | Minute | 60 | 60 | 60 | 60 |
| Electrical conductivity evaluation | | | — | A | A | A | B |
| Cross-section observation evaluation | | | — | A | A | A | A |

As shown in Table 2, in Comparative Example 2 in which the amount of the organic compound remaining up to the sintering temperature was reduced by the drying step and the condition of Formula (I) was not satisfied, joining failure occurred.

Examples 7 to 9 and Comparative Example 3

A joining material was prepared in the same manner as in Example 1, except that polypropylene carbonate) (manufactured by Sigma-Aldrich, 5% by weight reduction temperature: 190° C.) was used instead of MTPH, propylene carbonate (manufactured by Wako Pure Chemical Industries, Ltd., product name "4-methyl-1,3-dioxolan-2-one") was used instead of terpineol, MA-025KFD (50% volume average particle size: 5 μm, manufactured by MITSUI MINING & SMELTING CO., LTD.) was used instead of 2L3N, and the respective components were blended so that the content of each component became the value shown in Table 3. The production of the joined body, the evaluation of the joining material, and the joined state evaluation of the joined body were performed in the same manner as in Example 1, except that the obtained joining material was used, the drying step was performed under the conditions shown in Table 3 after the first step and before the second step, and the sintering temperature and the sintering time in the second step were changed to the conditions shown in Table 3. The results are shown in Table 3.

TABLE 3

|  |  |  | Unit | Example 7 | Example 8 | Example 9 | Comparative Example 3 |
|---|---|---|---|---|---|---|---|
| Joining material | CH-0200 | Ratio to whole metal particles | % by mass | 70.0 | 70.0 | 70.0 | 70.0 |
|  |  | Content in joining material | % by mass | 61.6 | 61.6 | 61.6 | 61.6 |
|  | MA-025KFD | Ratio to whole metal particles | % by mass | 30.0 | 30.0 | 30.0 | 30.0 |
|  |  | Content in joining material | % by mass | 26.4 | 26.4 | 26.4 | 26.4 |
|  | Propylene carbonate | Boiling point | ° C. | 240 | 240 | 240 | 240 |
|  |  | Content in joining material | % by mass | 7.3 | 9.3 | 10.8 | 11.4 |
|  | Poly(propylene carbonate) | 5% by weight reduction temperature | ° C. | 190 | 190 | 190 | 190 |
|  |  | Content in joining material | % by mass | 4.7 | 2.7 | 1.2 | 0.6 |
| $(M_1 - M_2)/M_1 \times 100$ |  |  | — | 5.02 | 2.99 | 1.35 | 0.64 |
| Drying temperature |  |  | ° C. | 90 | 90 | 90 | 90 |
| Drying time |  |  | Minute | 20 | 20 | 20 | 20 |
| Sintering temperature |  |  | ° C. | 300 | 300 | 300 | 300 |
| Sintering time |  |  | Minute | 60 | 60 | 60 | 60 |
| Electrical conductivity evaluation |  |  | — | A | A | A | B |
| Cross-section observation evaluation |  |  | — | A | A | A | B |

As shown in Table 3, it was confirmed that in the case of Examples 7 to 9 satisfying the condition of Formula (I) $((M_1-M_2)/M_1 \times 100 \geq 1.0)$, joining can be satisfactory performed.

Examples 10 to 12 and Comparative Example 4

A joining material was prepared in the same manner as in Example 1, except that MTPH was changed to KFA-2000 (acrylic resin, 5% by weight reduction temperature: 220° C., manufactured by GOO Chemical Co., Ltd.) and the respective components were blended so that the content of each component became the value shown in Table 4. The production of the joined body, the evaluation of the joining material, and the joined state evaluation of the joined body were performed in the same manner as in Example 1, except that the obtained joining material was used, the drying step was performed under the conditions shown in Table 4 after the first step and before the second step, and the sintering temperature and the sintering time in the second step were changed to the conditions shown in Table 4. The results are shown in Table 4.

TABLE 4

| | | | Unit | Example 10 | Example 11 | Example 12 | Comparative Example 4 |
|---|---|---|---|---|---|---|---|
| Joining material | CH-0200 | Ratio to whole metal particles | % by mass | 70.0 | 70.0 | 70.0 | 70.0 |
| | | Content in joining material | % by mass | 61.6 | 61.6 | 61.6 | 61.6 |
| | 2L3N | Ratio to whole metal particles | % by mass | 30.0 | 30.0 | 30.0 | 30.0 |
| | | Content in joining material | % by mass | 26.4 | 26.4 | 26.4 | 26.4 |
| | Terpineol | Boiling point | °C. | 214 | 214 | 214 | 214 |
| | | Content in joining material | % by mass | 8.4 | 9.6 | 10.9 | 11.5 |
| | KFA-2000 | 5% by weight reduction temperature | °C. | 220 | 220 | 220 | 220 |
| | | Content in joining material | % by mass | 3.6 | 2.4 | 1.1 | 0.5 |
| | $(M_1 - M_2)/M_1 \times 100$ | | — | 3.92 | 2.64 | 1.28 | 0.58 |
| | Drying temperature | | °C. | 90 | 90 | 90 | 90 |
| | Drying time | | Minute | 20 | 20 | 20 | 20 |
| | Sintering temperature | | °C. | 300 | 300 | 300 | 300 |
| | Sintering time | | Minute | 60 | 60 | 60 | 60 |
| Electrical conductivity evaluation | | | — | A | A | A | B |
| Cross-section observation evaluation | | | — | A | A | A | B |

As shown in Table 4, it was confirmed that in the case of Examples 10 to 12 satisfying the condition of Formula (I) $((M_1-M_2)/M_1 \times 100 \geq 1.0)$, joining can be satisfactory performed.

Examples 13 and 14 and Comparative Example 5

A joining material was prepared in the same manner as in Example 1, except that MTPH of the organic solvent was changed to tributyrin or MTPH was not used and the blending amount of each component was changed to the amount shown in Table 5. A joined body was produced in the same manner as in Example 1 except that the obtained joining material was used, and the evaluation of the joining material and the joined state evaluation of the joined body were performed in the same manner as in Example 1. The results are shown in Table 5.

TABLE 5

| | | | Unit | Example 13 | Example 14 | Comparative Example 5 |
|---|---|---|---|---|---|---|
| Joining material | CH-0200 | Ratio to whole metal particles | % by mass | 70 | 70 | 70 |
| | | Content in joining material | % by mass | 59 | 59 | 59 |
| | 2L3N | Ratio to whole metal particles | % by mass | 30 | 30 | 30 |
| | | Content in joining material | % by mass | 25 | 25 | 25 |
| | Terpineol | Boiling point | °C. | 214 | 214 | 214 |
| | | Content in joining material | % by mass | 8 | 10 | 16 |
| | Tributyrin | Boiling point | °C. | 310 | 310 | — |
| | | Content in joining material | % by mass | 8 | 6 | — |
| | $(M_1 - M_2)/M_1 \times 100$ | | — | 8.7 | 8.7 | 0.1 |
| | Drying temperature | | °C. | — | — | — |
| | Drying time | | Minute | — | — | — |
| | Sintering temperature | | °C. | 250 | 250 | 250 |
| | Sintering time | | Minute | 60 | 60 | 60 |
| Electrical conductivity evaluation | | | — | A | A | B |
| Cross-section observation evaluation | | | — | A | A | B |

As shown in Table 5, it was confirmed that, in Comparative Example 5 not satisfying the condition of Formula (I), joining failure occurred in joining without pressurization. The reason for this is speculated that the amount of the organic compound remaining between the metal particles was insufficient and a thermal stress was applied between the joint and the member before the temperature reached the sintering temperature so that the joint was peeled off from the member.

Example 15

A joining material was prepared in the same manner as in Example 1, except that MTPH of the organic solvent was changed to butyl stearate and the blending amount of each component was changed to the amount shown in Table 5. A joined body was produced in the same manner as in Example 1 except that the obtained joining material was used, and the evaluation of the joining material and the joined state evaluation of the joined body were performed in the same manner as in Example 1. The results are shown in Table 6.

TABLE 6

| | | | Unit | Example 15 |
|---|---|---|---|---|
| Joining material | CH-0200 | Ratio to whole metal particles | % by mass | 70 |
| | | Content in joining material | % by mass | 59 |
| | 2L3N | Ratio to whole metal particles | % by mass | 30 |
| | | Content in joining material | % by mass | 25 |
| | Terpineol | Boiling point | °C. | 214 |
| | | Content in joining material | % by mass | 8 |
| | Butyl stearate | Boiling point | °C. | 343 |
| | | Content in joining material | % by mass | 8 |
| | $(M_1 - M_2)/M_1 \times 100$ | | — | 8.7 |
| | Drying temperature | | °C. | — |
| | Drying time | | Minute | — |
| | Sintering temperature | | °C. | 250 |
| | Sintering time | | Minute | 60 |
| | Electrical conductivity evaluation | | — | A |
| | Cross-section observation evaluation | | — | A |

REFERENCE SIGNS LIST

10: first member, 11: metal pillar, 12: first substrate, 20: second member, 21: electrode pad, 22: second substrate, 30: joining material (joint), 31: sintered body (joint), 50: laminated body, 100: joined body.

The invention claimed is:

1. A method for producing a joined body, the method comprising:
    a first step of preparing a laminated body which includes a first member having a metal pillar provided on a surface thereof, a second member having an electrode pad provided on a surface thereof and being disposed with the metal pillar and the electrode pad facing each other, and a joining material provided between the metal pillar and the electrode pad and containing metal particles and an organic compound; and
    a second step of heating the laminated body to sinter the joining material at a predetermined sintering temperature,
    wherein the joining material satisfies the condition of the following Formula (I)

$$(M_1 - M_2)/M_1 \times 100 \geq 1.0 \quad (I)$$

wherein, in Formula (I), $M_1$ represents a mass of the joining material when a temperature of the joining material reaches the predetermined sintering temperature in the second step, and $M_2$ represents a non-volatile content in the joining material.

2. The method for producing a joined body according to claim 1, wherein the organic compound includes at least one selected from the group consisting of an organic solvent having a boiling point of 300° C. or higher and a thermally decomposable resin of which a 5% by weight reduction temperature in a reducing atmosphere is 100° C. or higher.

3. The method for producing a joined body according to claim 2, wherein the thermally decomposable resin includes at least one selected from the group consisting of polycarbonate, poly(meth)acrylic acid, poly(meth)acrylic acid ester, and polyester.

4. The method for producing a joined body according to claim 2, wherein the total of a content of the organic solvent and a content of the thermally decomposable resin is 1.0% by mass or more on the basis of the total mass of the joining material.

5. The method for producing a joined body according to claim 1, wherein the sintering temperature is 150 to 300° C.

6. The method for producing a joined body according to claim 1, wherein in the second step, the joining material is sintered without pressurization or under a pressure of 0.1 MPa or less.

7. The method for producing a joined body according to claim 1, wherein the metal particles include sub-micro copper particles having a volume average particle size of 0.11 to 0.80 μm and flake-shaped micro copper particles having a volume average particle size of 2.0 to 50 μm and an aspect ratio of 3.0 or more,
    a content of the sub-micro copper particles is 30 to 90% by mass on the basis of the total mass of the metal particles, and
    a content of the micro copper particles is 10 to 50% by mass on the basis of the total mass of the metal particles.

8. The method for producing a joined body according to claim 1, wherein the organic compound in the joining material provided between the metal pillar and the electrode pad comprises an organic solvent having a boiling point of 300° C. or higher at a content of 1.0 to 20.0% by mass on the basis of the total mass of the joining material.

9. The method for producing a joined body according to claim 1, wherein the organic compound in the joining material provided between the metal pillar and the electrode pad comprises a thermally decomposable resin of which a 5% by weight reduction temperature in a reducing atmosphere is 100° C. or higher at a content of 1.0 to 20.0% by mass on the basis of the total mass of the joining material.

10. A joining material being used for joining a metal pillar and an electrode pad, the joining material comprising:
    metal particles; and
    an organic compound including at least one selected from the group consisting of an organic solvent having a boiling point of 300° C. or higher and a thermally decomposable resin of which a 5% by weight reduction temperature in a reducing atmosphere is 100° C. or higher.

11. The joining material according to claim 10, wherein the thermally decomposable resin includes at least one selected from the group consisting of polycarbonate, poly(meth)acrylic acid, poly(meth)acrylic acid ester, and polyester.

12. The joining material according to claim 10, wherein the total of a content of the organic solvent and a content of the thermally decomposable resin is 1.0% by mass or more on the basis of the total mass of the joining material.

13. The joining material according to claim 10, wherein the metal particles include sub-micro copper particles having a volume average particle size of 0.11 to 0.80 μm and flake-shaped micro copper particles having a volume average particle size of 2.0 to 50 μm and an aspect ratio of 3.0 or more,
   a content of the sub-micro copper particles is 30 to 90% by mass on the basis of the total mass of the metal particles, and
   a content of the micro copper particles is 10 to 50% by mass on the basis of the total mass of the metal particles.

14. The joining material according to claim 10, wherein the joining material is used for joining the metal pillar and the electrode pad by being sintered at a sintering temperature of 150 to 300° C.

15. The joining material according to claim 10, wherein the joining material is used for joining the metal pillar and the electrode pad by being sintered without pressurization or under a pressure of 0.1 MPa or less.

16. The joining material according to claim 10, wherein the organic compound includes the organic solvent having a boiling point of 300° C. or higher at a content of 1.0 to 20.0% by mass on the basis of the total mass of the joining material.

17. The joining material according to claim 10, wherein the organic compound includes the thermally decomposable resin of which a 5% by weight reduction temperature in a reducing atmosphere is 100° C. or higher at a content of 1.0 to 20.0% by mass on the basis of the total mass of the joining material.

* * * * *